(12) United States Patent  
Tuntasood et al.

(10) Patent No.: US 7,501,321 B2  
(45) Date of Patent: Mar. 10, 2009

(54) NAND FLASH MEMORY WITH DENSELY PACKED MEMORY GATES AND FABRICATION PROCESS

(75) Inventors: Prateep Tuntasood, Santa Clara, CA (US); Der-Tsyr Fan, Hsinchu (TW); Chiou-Feng Chen, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 218 days.

(21) Appl. No.: 11/535,694

(22) Filed: Sep. 27, 2006

(65) Prior Publication Data

US 2007/0032018 A1 Feb. 8, 2007

Related U.S. Application Data

(62) Division of application No. 10/900,413, filed on Jul. 26, 2004, now abandoned.

(51) Int. Cl.
*H01L 21/336* (2006.01)

(52) U.S. Cl. .................................. 438/258; 257/E21.69
(58) Field of Classification Search ................ 438/258, 438/267; 257/E21.69
See application file for complete search history.

(56) References Cited

U.S. PATENT DOCUMENTS

| | | | |
|---|---|---|---|
| 4,959,812 A | 9/1990 | Momodomi | |
| 5,050,125 A | 9/1991 | Momodomi | |
| 5,677,556 A | 10/1997 | Endoh | |
| 6,157,056 A * | 12/2000 | Takeuchi et al. | 438/258 |
| 6,337,245 B1 * | 1/2002 | Choi | 438/258 |
| 6,580,120 B2 | 6/2003 | Haspeslagh | |
| 6,885,586 B2 | 4/2005 | Chen | |
| 6,885,590 B1 | 4/2005 | Zheng | |
| 2003/0025147 A1 | 2/2003 | Nomoto et al. | |

* cited by examiner

*Primary Examiner*—Chandra Chaudhari
(74) *Attorney, Agent, or Firm*—Edward S. Wright

(57) ABSTRACT

NAND flash memory cell array and fabrication process in which cells having memory gates and charge storage layers are densely packed, with the memory gates in adjacent cells either overlapping or self-aligned with each other. The memory cells are arranged in rows between bit line diffusions and a common source diffusion, with the charge storage layers positioned beneath the memory gates in the cells. The memory gates are either polysilicon or polycide, and the charge storage gates are either a nitride or the combination of nitride and oxide. Programming is done either by hot electron injection from silicon substrate to the charge storage gates to build up a negative charge in the charge storage gates or by hot hole injection from the silicon substrate to the charge storage gates to build up a positive charge in the charge storage gates. Erasure is done by channel tunneling from the charge storage gates to the silicon substrate or vice versa, depending on the programming method. The array is biased so that all of the memory cells can be erased simultaneously, while programming is bit selectable.

9 Claims, 14 Drawing Sheets

US 7,501,321 B2

NAND FLASH MEMORY WITH DENSELY PACKED MEMORY GATES AND FABRICATION PROCESS

RELATED APPLICATION

This is a division of Ser. No. 10/900,413, filed Jul. 26, 2004 now abandoned.

BACKGROUND OF THE INVENTION

1. Field of Invention

This invention pertains generally to semiconductor memory devices and, more particularly, to a NAND flash memory and process of fabricating the same.

2. Related Art

Nonvolatile memory is currently available in several forms, including electrically programmable read only memory (EPROM), electrically erasable programmable read only memory (EEPROM), and flash EEPROM. Flash memory has been widely used for high volume data storage in devices such as memory cards, personal digital assistants (PDA's), cellular phones, and MP3 players. Such applications require high density memory, with smaller cell size and reduced cost of manufacture.

The traditional NOR-type stack-gate flash memory cell usually has a bit line contact, a source region, a floating gate, and a control gate, with the control gate being positioned directly above the floating gate. Its relatively large cell size prevents it from being used in very high density data storage applications.

Cell size is smaller in a NAND flash memory array having a series of stack-gate flash memory cells connected in series between a bit-line and a source line, with only one bit-line contact, as illustrated in FIG. 1 and described in greater detail in U.S. Pat. Nos. 4,959,812 and 5,050,125. In this array, a plurality of stack-gate memory cells 21 are connected in series between a bit line diffusion 22 and a source diffusion 23. The cells are formed in a P-well 24 in a substrate 26 of either N- or P-type silicon. Each of the cells has a floating gate 27 fabricated of a conductive material such as polysilicon and a control gate 28 fabricated of a conductive material such as polysilicon or polycide. The control gate is above and in vertical alignment with the floating gate.

Two select gates 29, 30 are included in the array, one near the bit line diffusion 22 and one near source diffusion 23. The bit line 31 for each row is connected to the bit line diffusion by a bit line contact 32 contact. Diffusions 33 are formed in the substrate between the stacked gates and between the stacked gates and the select gates to serve as source and drain regions for the transistors in the memory cells. The bit line diffusions, source diffusion, and diffusions 33 are doped with N-type dopants.

To erase the memory cell, a positive voltage of about 20 volts is applied between the P-well and the control gates, which causes the electrons to tunnel from the floating gates to the channel regions beneath them. The floating gates thus become positively charged, and the threshold voltage of the stack-gate cells becomes negative.

To program the memory cells, the control gates are biased to a level of about 20 volts positive relative to the P-well. As electrons tunnel from the channel region to the floating gates, the floating gates are negatively charged, and the threshold voltage of the stack-gate cells becomes positive. By changing the threshold voltage of a stack-gate cell, the channel beneath it can be in either a non-conduction state (logical) or a conduction state (logical when a zero voltage is applied to the control gate during a read operation.

However, as the fabrication process advances to very smaller geometry, e.g., tens of nanometer, it is difficult to form a high-voltage coupling ratio which is sufficient for program and erase operations while maintaining a small cell size.

OBJECTS AND SUMMARY OF THE INVENTION

It is in general an object of the invention to provide a new and improved semiconductor device and process of fabricating the same.

Another object of the invention is to provide a semiconductor device and process of the above character which overcomes the limitations and disadvantages of the prior art.

These and other objects are achieved in accordance with the invention by providing a memory cell array and fabrication process in which memory cells are densely packed in rows between bit line diffusions and a common source diffusion. Each cell has a memory gate and a charge select gate, with the memory gates in adjacent cells being self-aligned with and/or partially overlapping each other.

In some embodiments, programming is done by hot electron injection from the underlying substrate to the charge storage gates to build up a negative charge in the charge storage gates, while in others it is done by hot hole injection from the silicon substrate to the charge storage gates to build up a positive charge in the charge storage gates. Erasure is done by channel tunneling from the charge storage gates to the silicon substrate or vice versa, depending on the programming method. The array is biased so that all of the memory cells in it can be erased simultaneously, while programming is bit selectable.

DETAILED DESCRIPTION

Figure 1:
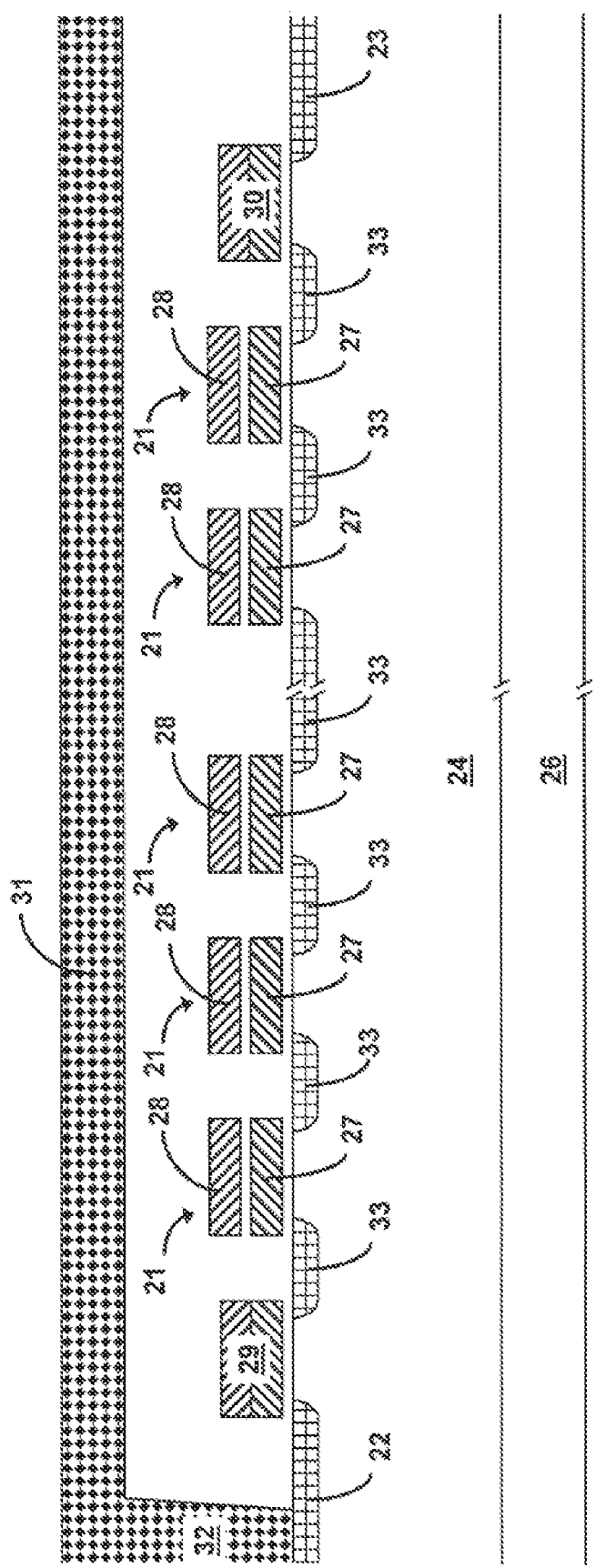
FIG. 1 is a cross-sectional view of a prior art NAND flash memory array with a series of stack-gate flash memory cells.
Figure 2:
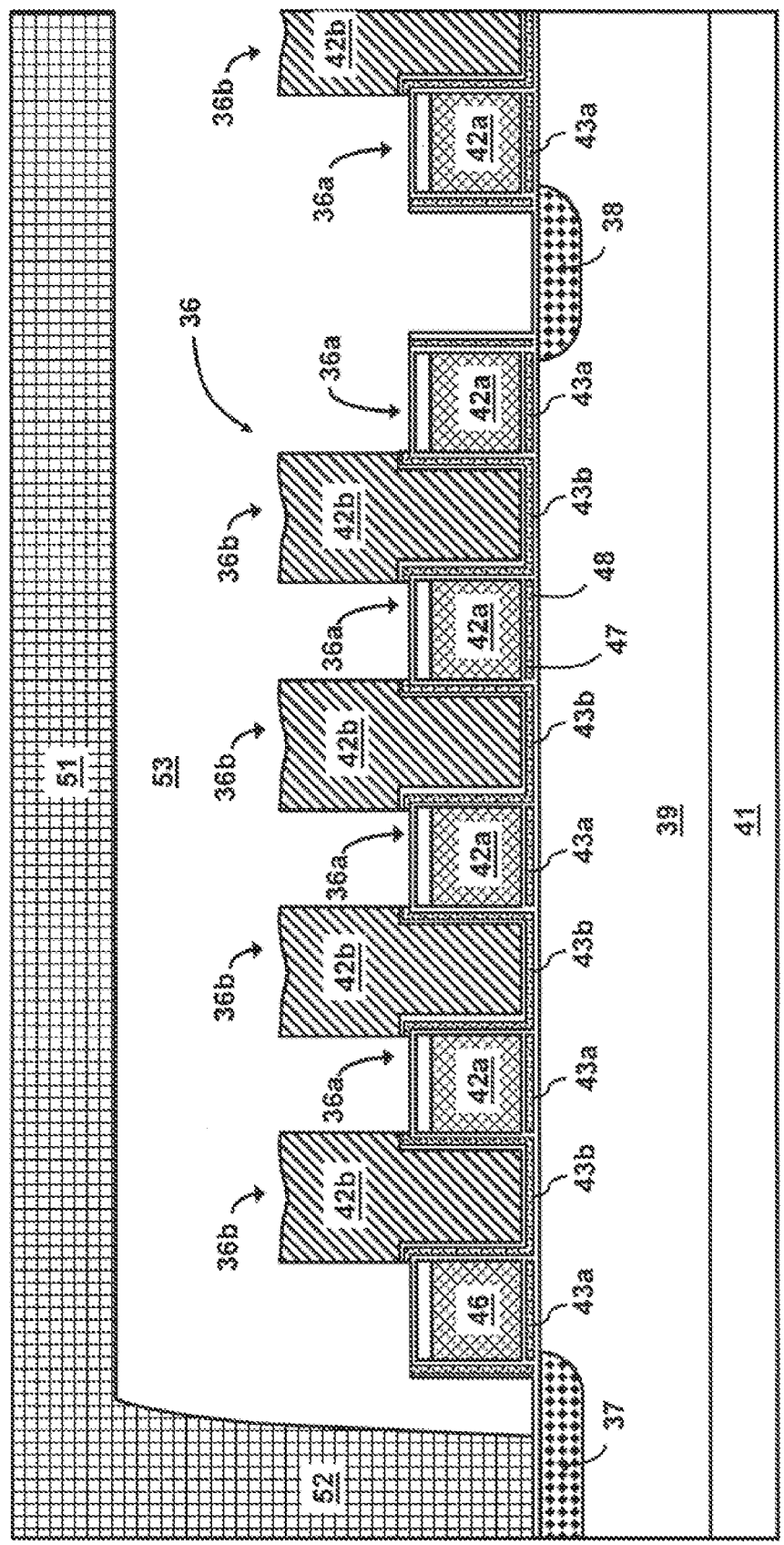
FIG. 2 is a cross-sectional view of one embodiment of a NAND flash memory cell array incorporating the invention, taken along line 2-2 in FIG. 4.

As illustrated in FIG. 2, the memory includes an array of NAND flash memory cells 36 which are arranged in rows between bit line diffusions 37 and a common source diffusion 38 formed in a P-type well 39 in the upper portion of a substrate 41 and doped with an N-type material. As discussed more fully hereinafter, in the preferred process of fabricating the cell array, the cells are formed in two groups 36a, 36b, with the cells in one group being interposed between the cells in the other. However, it will be understood that the array can be fabricated by other processes and that all of the cells can be formed in a single group.

The cells have memory or control gates 42a, 42b and charge storage gates 43a, 43b, with the control gates positioned above and aligned with the charge storage gates. A row select gate 46 is formed at the end of the row next to the bit line diffusion, with a passive (unused) charge storage gate 43a beneath it. The select gate partially overlaps the bit line diffusion, and the control gate 42a at the end of the row opposite the select gate partially overlaps the source diffusion.

Control gates 42 and select gates 46 are fabricated of a conductive material such as a doped polysilicon or polycide, and charge storage gates are fabricated of nitride or a combination of nitride and oxide. Dielectric films 47 are formed between the control gates and the charge storage gates, and gate insulators 48 are formed beneath the charge storage gates. The dielectric films can be either a pure oxide or a nitrided oxide.

Figure 3:
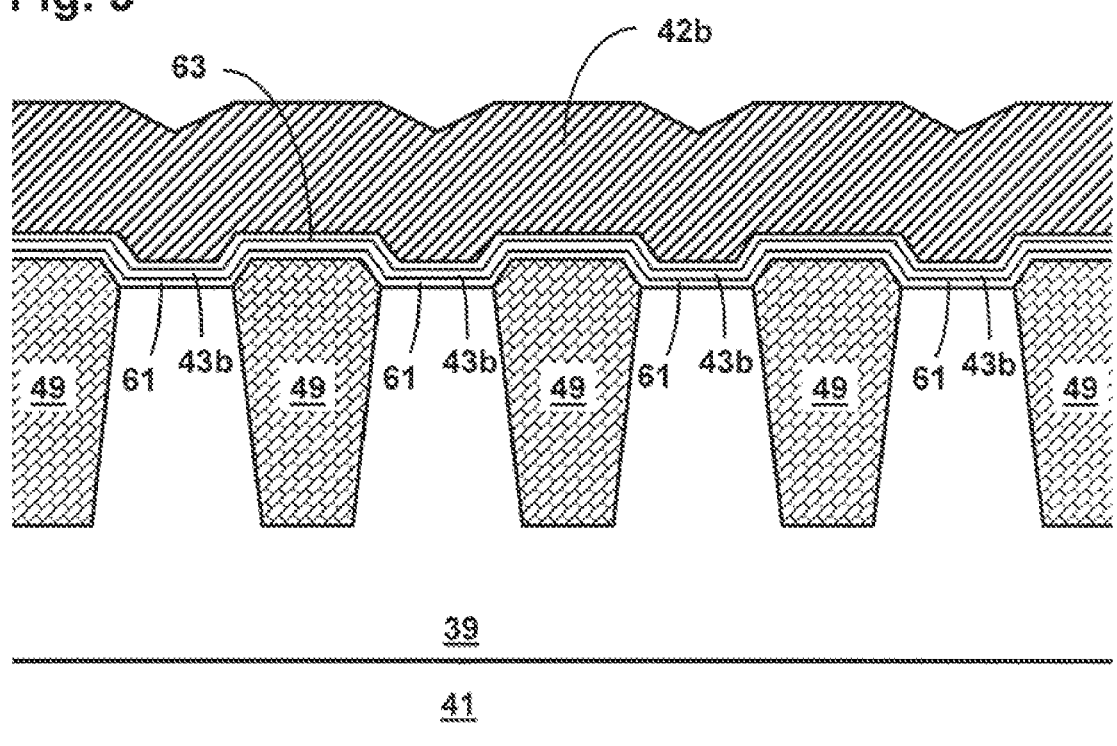
FIG. 3 is a cross-sectional view of the embodiment of FIG. 2, taken along line 2-2 in FIG. 4.
Figure 4:
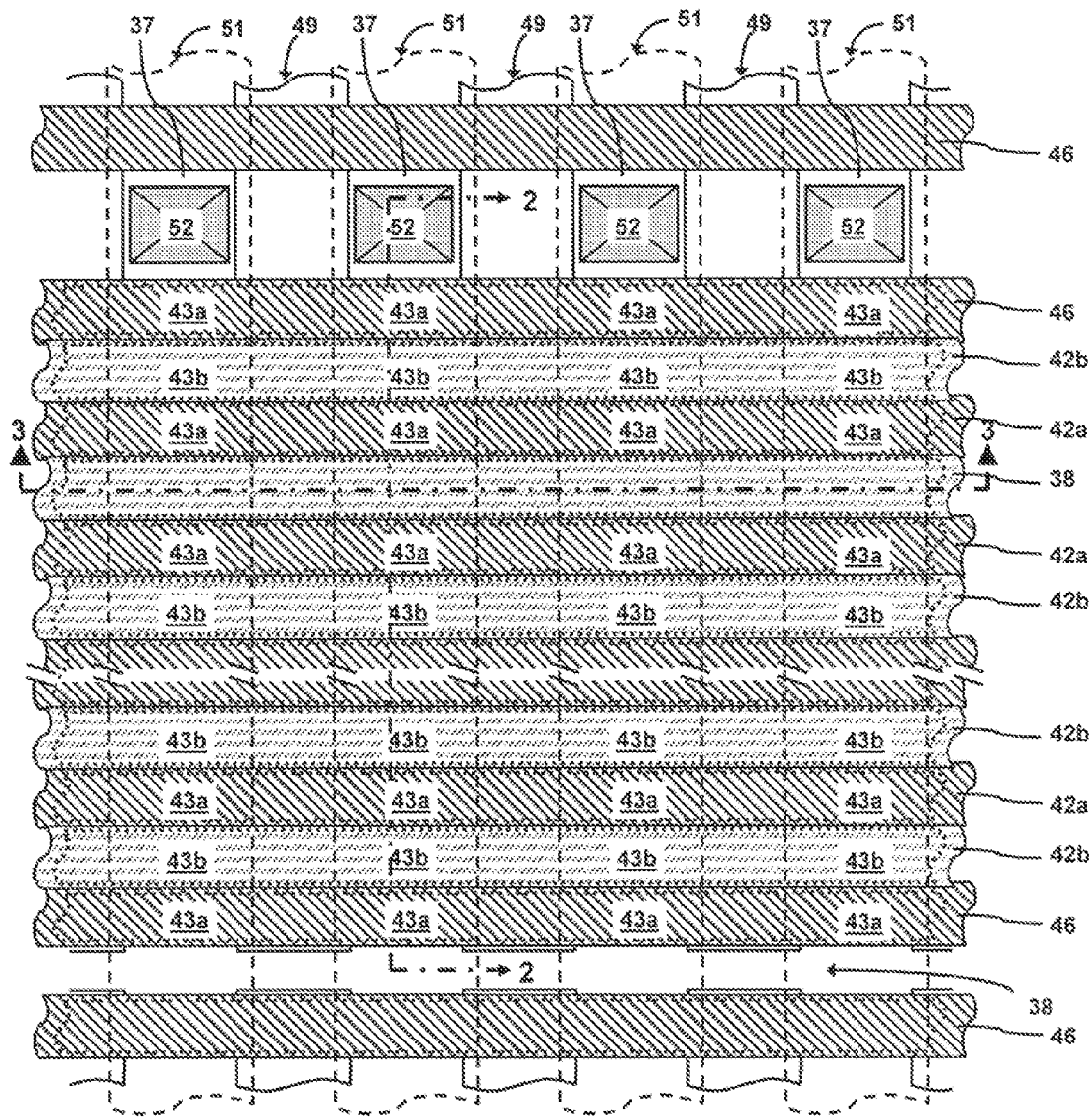
FIG. 4 is a top plan view of the embodiment of FIG. 2.

As best seen in FIG. 3 and FIG. 4, isolation regions 49 are formed in the substrate between the adjacent rows of cells 36, with control gates 42a, 42b all extending in a direction parallel to the source diffusion and crossing over the charge storage gates and isolation regions. Bit lines 51 are positioned above the rows of cells, crossing over select gates and control gates, with contacts 52 extending between the bit lines and the bit line diffusions. The bit lines are thus perpendicular to the select gates, control gates, and common source diffusions. The source diffusions extend continuously in a direction perpendicular to the rows, and are shared by groups of cells in the rows on both sides of them.

The memory cell array of FIGS. 2-4 can be fabricated by the process illustrated in FIGS. 5A-5F. In this process, an oxide layer 53 is thermally grown to a thickness of about 40 Å to 100 Å on a monocrystalline silicon substrate which, in the embodiment illustrated, is in the form of a P-type substrate 41 in which a P-type well 39 is formed. Alternatively, if desired, an N-type well can be formed in the P-type substrate, in which case the P-type well will be formed in the N-type well.

A charge storage layer 54 of a nitride or the combination of nitride and oxide is formed on the thermal oxide 53 . Then, another dielectric layer 56 is formed on the charge storage layer 54. This dielectric can be a pure oxide layer or a nitrided oxide layer. The charge storage layer 54 has a thickness about 60 Å to 200 Å and the dielectric layer 56 has a thickness about 30 Å to 100 Å.

A conductive layer 57 of polysilicon or polycide (poly-1) is deposited on dielectric film 56. This layer has a thickness on the order of 1000 Å-2500 Å, and is doped with phosphorus, arsenic or boron to a level on the order of $10^{20}$ to $10^{21}$ per cm$^3$. A CVD oxide or nitride layer 58 having a thickness on the order of 300 Å-1000 Å is deposited on the poly-1 layer, and is used as a mask to prevent the poly-1 material from etching away during subsequent dry etching steps.

Figure 5A:
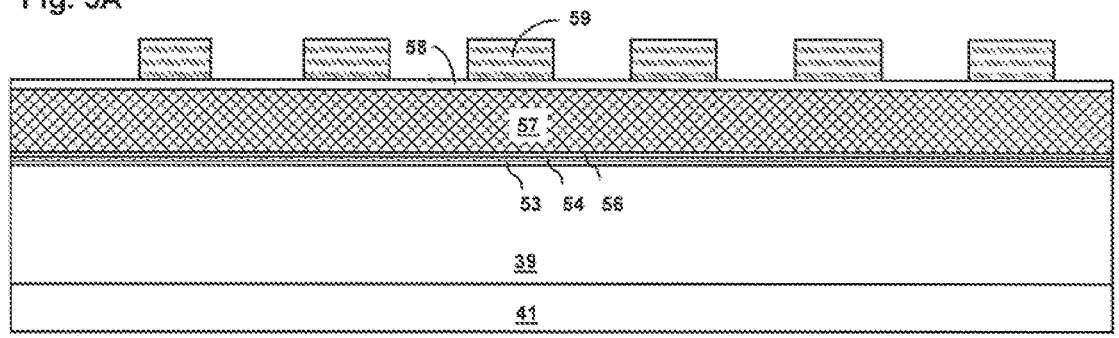
FIGS. 5A-5F are schematic cross-sectional views illustrating the steps in one embodiment of a process for fabricating the memory cell array of FIG. 2 in accordance with the invention.
Figure 5B:
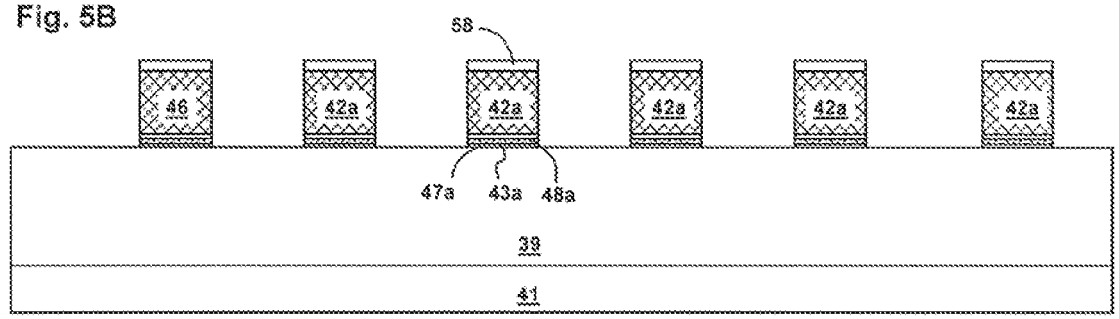

A photolithographic mask 59 is formed over layer 58 to define the memory gates and the select gate, and the unmasked portions of that layer and poly-1 layer 57 are etched away anisotropically, leaving only the portions of the poly-1 which form the select gate 46, the memory gate 42 adjacent to the source diffusion area, and the memory gates 42a. The exposed portions of the dielectric 56, the underlying portions of the charge storage layer 54, and the dielectric 53 are then etched away anisotropically to form the charge storage gates 43a, as illustrated in FIG. 5B.

Figure 5C:
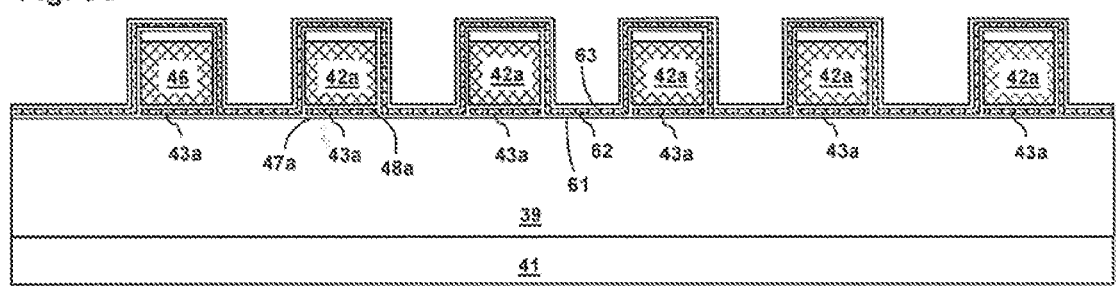

Then, as shown in FIG. 5C, a dielectric layer 61 is formed on the exposed silicon substrate and the side walls of the memory gates and select gate. This dielectric can be a pure oxide film or a nitrided oxide film. A second layer of charge storage film 62, which can be a pure oxide film or a nitrided oxide film, is then formed on dielectric 61, and another layer of dielectric film 63 is formed on the charge storage film.

Figure 5D:
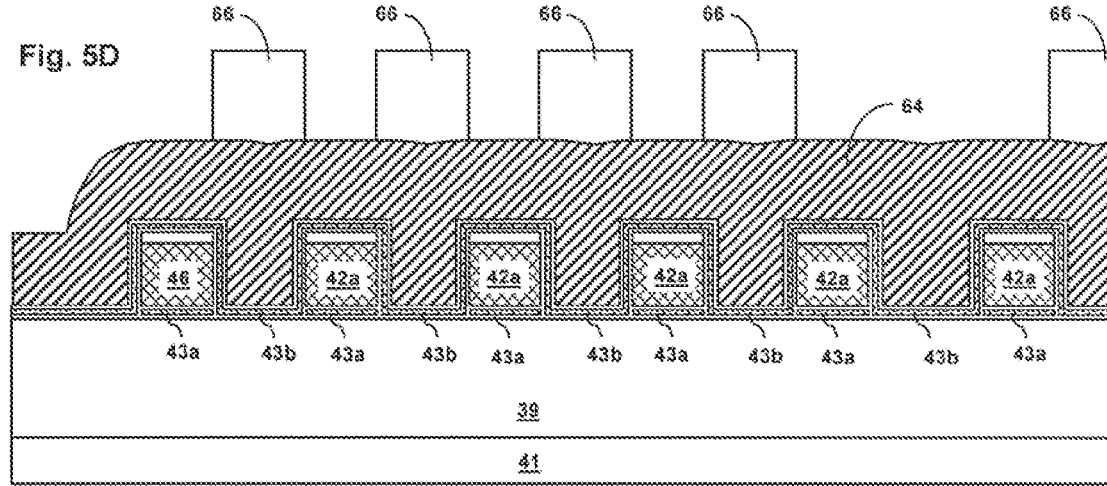
Figure 5E:
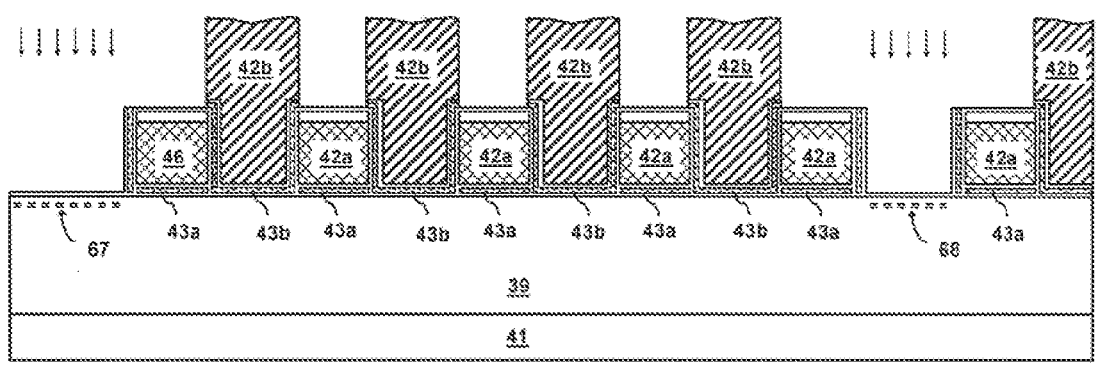

As illustrated in FIG. 5D, a conductive layer 64 of polysilicon or polycide (poly-2) is deposited on dielectric film 63 to a thickness on the order of 1000 Å to 2500 Å and is doped with phosphorus, arsenic or boron to a level on the order of $10^{20}$ to $10^{21}$ per cm$^3$. A photolithographic mask 66 is then formed over poly-2 layer 64 to define the second set of memory gates. The unmasked portions of the poly-2 layer 64, dielectric layer 63, and charge storage layer 62 are etched away anisotropically to form the second set of memory or control gates 42b, as illustrated in FIG. 5E. Thereafter, as shown in FIGS. 5E and 5F, dopants such as $P^{31}$ or $As^{75}$ are implanted into regions 67, 68 in the exposed portions of the substrate next to select gate 46 and the memory gate 42a at the opposite end of the row to form bit line diffusion 37 and source diffusion 38.

Figure 5F:
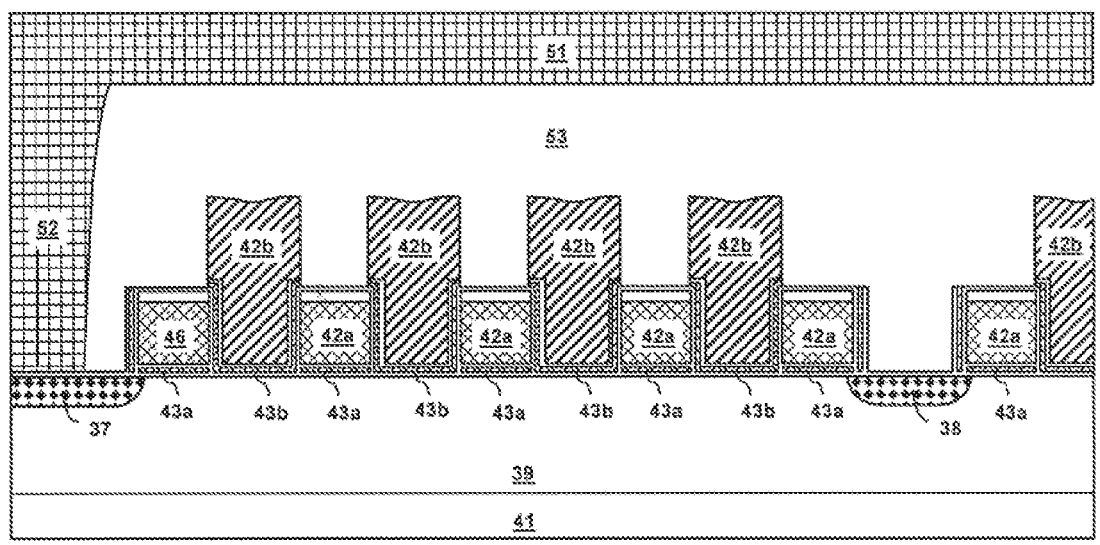

A glass material 53 such as phosphosilicate glass (PSG) or borophosphosilicate glass (BPSG) is then deposited across the entire wafer, and etched to form openings for bit line contacts 52, as shown in FIG. 5F. Finally, a metal layer is deposited over the glass and patterned to form bit lines 51 and bit line contacts 52.

Figure 6:
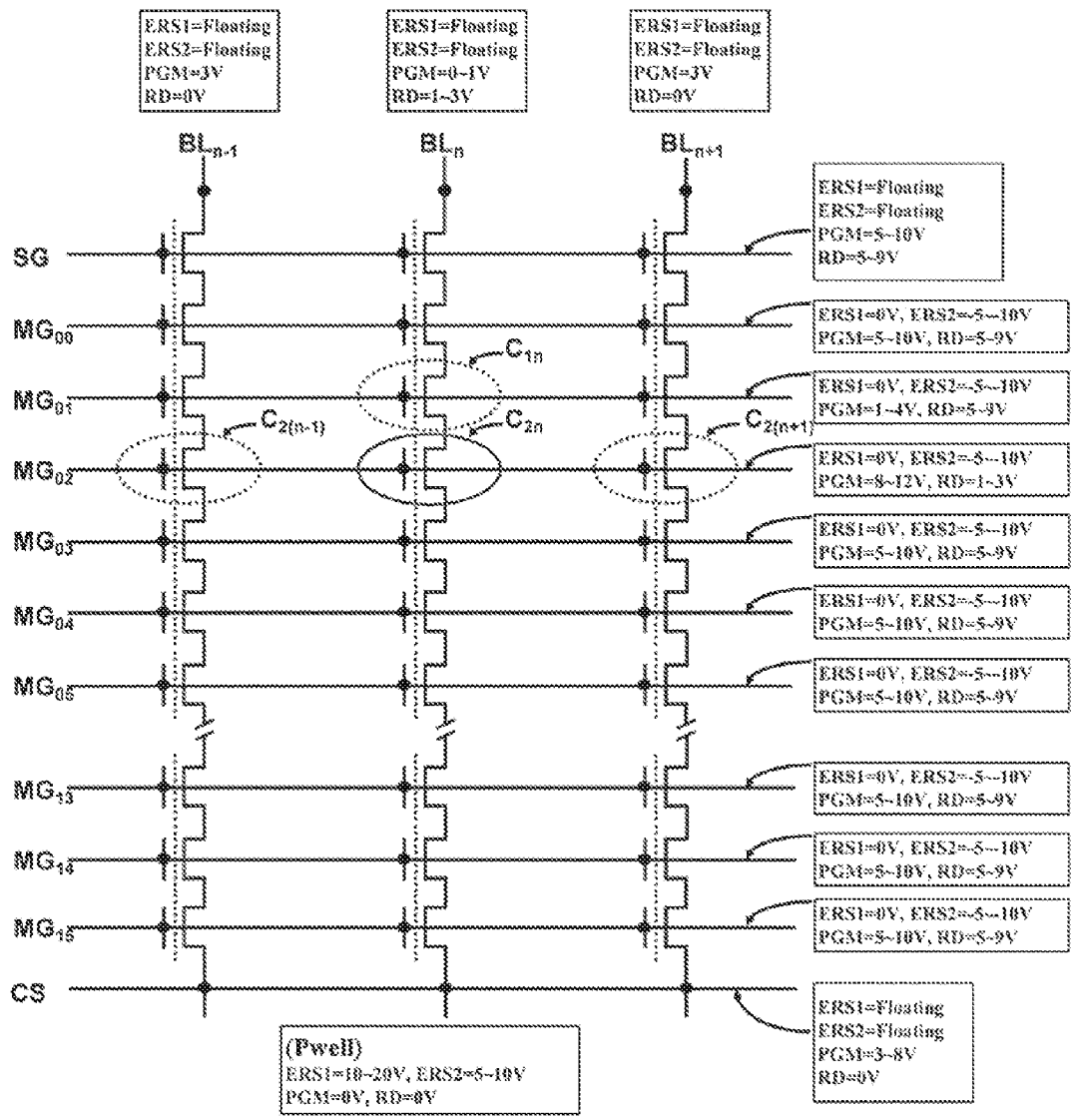
FIGS. 6 and 7 are circuit diagrams of a small memory arrays as in the embodiment of FIG. 2, showing exemplary bias conditions for erase, program and read operations.

Operation and use of the memory cell array can be described with reference to FIGS. 6 and 7 where two sets of exemplary bias voltages for erase (ERS), program (PGM) and read (RD) operations are shown next to the terminals of the array. In the example of FIG. 6, memory cell $C_{2n}$ is selected. This cell is located at the intersection of memory gate $MG_{02}$ and bit line $BL_n$, and is encircled on the drawing for ease of location. All of the other memory cells in the array are unselected.

With the bias conditions shown in FIG. 6, erasing can be done in two different ways. In the first (erase mode 1 or ERS1), the memory gate is biased at 0 volts, the select gate SG, the bit line and common source are floating, and P-well is biased at 10 to 20 volts. With these bias conditions, a uniform channel tunneling occurs. As the charge storage gate becomes more positively charged, the threshold voltage of the memory cell, which in this embodiment is preferably on the order of −1 to 1 volt, becomes lower. This results in an inversion layer in the channel beneath the charge storage gate when the control gate is biased at about 1.5 volts. Therefore, the memory cell goes into the conductive state (logic 1) after the erase operation.

In the second erase mode (erase mode 2 or ERS2), the memory gate is negatively biased at −5 to −10 volts, the select gate SG, the bit line and common source are floating, and P-well is biased at 5 to 10 volts. With these bias conditions, a uniform channel tunneling occurs. As the charge storage gate becomes more positively charged, the threshold voltage of the memory cell, which in this embodiment is preferably on the order of −1 to 1 volt, becomes lower. This results in an inversion layer in the channel beneath the charge storage gate when the control gate is biased at about 1.5 volts. Therefore, the memory cell goes into the conductive state (logic 1) after the erase operation.

During a program operation, the memory gate $MG_{02}$ of the selected memory cell $C_{2n}$ is biased to a level of 8-12 volts. The memory gate of the memory cell above it, in this case, the memory gate $MG_{01}$ of the memory cell $C_{1n}$ is biased to a level of 1-4 volts. If the selected memory cell is the first cell $C_{0n}$, then the select gate SG is biased to a level of 1-4 volts. During a program of memory cell $C_{2n}$, 5-10 volts is applied to select gates SG and to the memory gates of the other memory cells in the same bit line direction as the selected cell $C_{2n}$, 0-1 volts is applied to the bit line, 0 volts is applied to P-well, and 3-8 volts is applied to the common source.

With these bias conditions, most of the voltage between the common source and the bit line appears across the mid-channel region between the cell $C_{1n}$ and the charge storage gate of the selected cell $C_{2n}$, resulting in a high electric field in that region. In addition, a strong vertical electric field is established across the oxide between the mid-channel region and the charge storage gate of the selected cell $C_{2n}$ from the high voltage 8-12 volts applied on the memory gate $MG_{02}$. When electrons flow from the bit line to the common source during the program operation, they are accelerated by the electric field across the mid-channel region, and some of them become heated. Some of the hot electrons get accelerated by the vertical field, which causes them to overcome the energy barrier of the oxide (about 3.1 eV) and inject into the charge storage gate.

At the end of the program operation, the charge storage gate is negatively charged, and the threshold voltage of the memory cell, which preferably is on the order of 2-4 volts, becomes higher. Thus, the memory cell is turned off when the control gate is biased at about 1.5 volts during a read operation. Following a program operation, the memory cell goes into a non-conductive state (logic 0).

For the unselected memory cells $C_{2(-1)}$ and $C_{2(n+1)}$ which share the same memory gate $MG_{02}$ with the selected cell $C_{2n}$, the bit line is biased at 3 volts, the memory gate $MG_{01}$ of the memory cells above them is at 1-4 volts, and the memory gate $MG_{02}$ is at 8-12 volts. Thus, the memory cells $C_{1(-1)}$ and $C_{1(n+1)}$ are turned off, and there is no mid-channel hot carrier injection taking place in cells $C_{2(-1)}$ and $C_{2(n+1)}$. The other unselected memory cells in the bit line direction, e.g. $C_{0n}$ and $C_{3n}$, are biased with 0-1 volts to the bit line, 5-10 volts to the memory gates, and 5-10 volts to the memory gates just before them, which minimizes the mid-channel hot carrier injection, and the charge storage gate charges are unchanged.

In the read mode, the memory gate of the selected memory cell $C_{2n}$ is biased at about 1.5 volts, the common source is biased to 0 volt, 1-3 volts is applied to the bit line. The unselected memory cells in the bit line direction, e.g. $C_{0n}$ and $C_{3n}$, are turned on by applying 5-9 volts to their memory gates. When the memory cell is erased, the read shows a conductive state because the channel of selected cell is turned on, and the other cells in the same bit line direction also turned on. Thus, a logic 1 is returned by the sense amplifier. When the memory cell is programmed, the read shows a non-conductive state because the channel of the selected cell is turned off, and hence the sense amplifier returns a logic 0. In the unselected memory cells $C_{2(-1)}$ and $C_{2(n+1)}$, both the bit line and common source nodes are biased at 0 volts, and there is no current flow between the bit line and the common source nodes.

Figure 7:
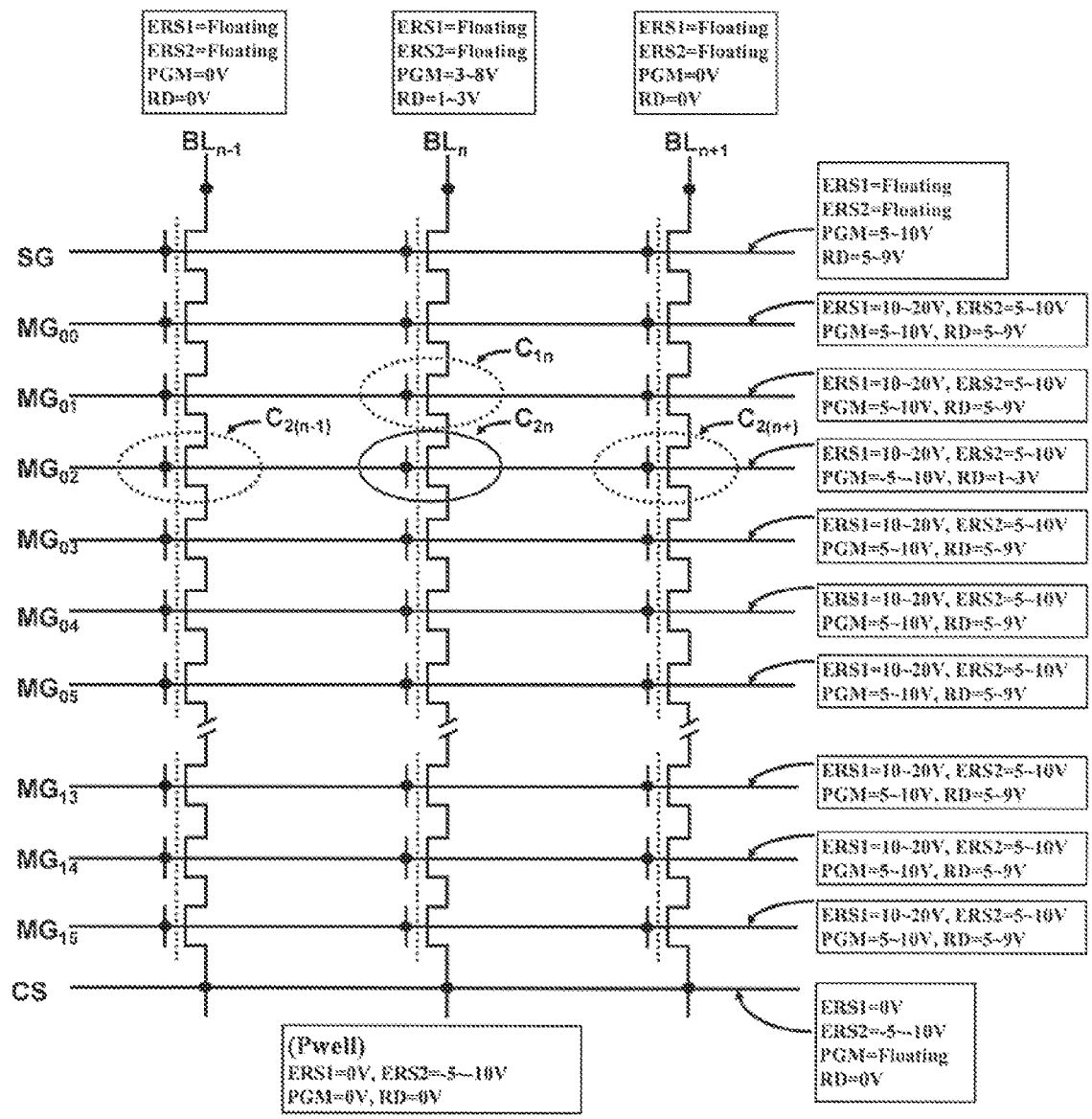

In the example of FIG. 7, memory cell $C_{2n}$ is again selected. This cell is located at the intersection of memory gate $MG_{02}$ and bit line $BL_n$, and is encircled on the drawing for ease of location. All of the other memory cells in the array are unselected.

As in the previous example, erasing can be done in two different ways. In erase mode 1 (ERS1), the memory gate is biased at 10 to 20 volts, the select gate SG, the bit line and common source are floating, and P-well is biased at 0 volts. In erase mode 2 (ERS2), the memory gate is negatively biased at 5 to 10 volts, the select gate SG, the bit line and common source are floating, and P-well is negatively biased at −5 to −10 volts. With either set of bias conditions, a uniform channel tunneling occurs. As the charge storage gate becomes more negatively charged, the threshold voltage of the memory cell, which in this embodiment is preferably on the order of 2 to 4 volts, becomes higher. This results in an channel beneath the charge storage gate to be turned off when the memory gate is biased at about 1.5 volts. Therefore, the memory cell goes into the non-conductive state (logic 0) after the erase operation.

During a program operation, the memory gate $MG_{02}$ of the selected memory cell $C_{2n}$ is negatively biased to a level of −5 to −10 volts. A bias of 5-10 volts is applied to select gate SG and to the memory gates of the other memory cells in the same bit line direction as the selected cell $C_{2n}$, 3-8 volts is applied to the bit line, 0 volts is applied to P-well, and the common source is floating.

With these bias conditions, most of the voltage between bit line voltage and the memory gate $MG_{02}$ voltage appears across the silicon substrate and the charge storage gate of the selected cell causing hot hole injection happens between the silicon substrate and the charge storage gate of the selected cell. As the charge storage gate becomes more positively charged, the threshold voltage of the memory cell $C_{2n}$, which is preferably on the order of −1 to 1 volt in this embodiment, becomes lower. This results in an inversion layer in the channel beneath the charge storage gate when the control gate is biased at about 1.5 volts. Therefore, the memory cell goes into the conductive state (logic 1) after the program operation.

For the unselected memory cells $C_{2(-1)}$ and $C_{2(n+1)}$ which share the same memory gate $MG_{02}$ with the selected cell $C_{2n}$, the bit line is biased at 0 volts instead of 3-8 volts. Thus less voltage drops across the silicon substrate and the charge storage gates of the unselected memory cells $C_{2(-1)}$ and $C_{2(n+1)}$. Therefore, hot hole injection is minimized and the charge storage gate charges are unchanged.

In the read mode, the memory gate of the selected memory cell $C_{2n}$ is biased at about 1.5 volts, the common source is biased to 0 volt, 1-3 volts is applied to the bit line. The unselected memory cells in the bit line direction, e.g. $C_{0n}$ and $C_{3n}$, are turned on by applying 5-9 volts to their memory gates. When the memory cell is erased, the read shows a non-conductive state because the channel of selected cell is turned off, and the other cells in the same bit line direction also turned on. Thus, a logic 0 is returned by the sense amplifier. When the memory cell is programmed, the read shows a conductive state because the channel of the selected cell is turned on, and hence the sense amplifier returns a logic 1. In the unselected memory cells $C_{2(-1)}$ and $C_{2(n+1)}$, both the bit line and common source nodes are biased at 0 volts, and there is no current flow between the bit line and the common source nodes.

Three additional embodiments of a process for fabricating the memory cell array of FIGS. 2-4 are illustrated in FIGS. 8A-8F, FIGS. 9A-9F, and FIGS. 10A-10F. Corresponding elements are designated by like reference numerals in all four embodiments.

Figure 8A:
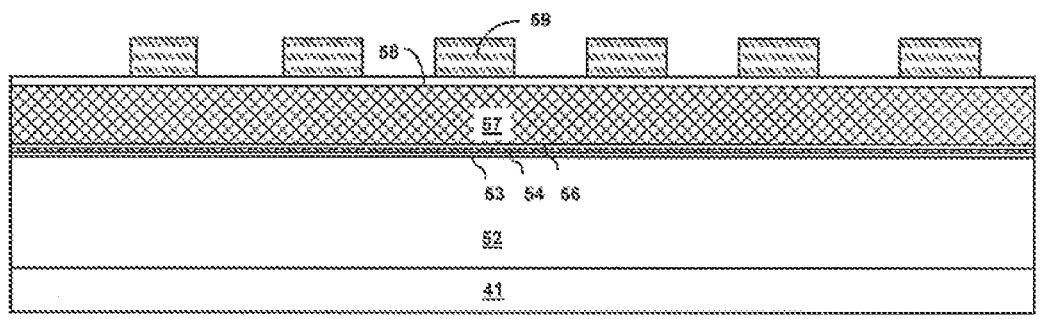
FIGS. 8A-8F, 9A-9F and 10A-10F are schematic cross-sectional views illustrating the steps in additional embodiments of a process for fabricating a NAND flash memory cell array in accordance with the invention.
Figure 8B:
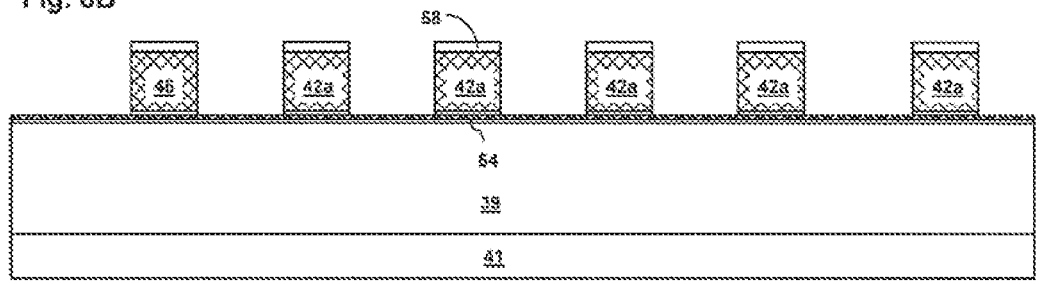

In the embodiment of FIGS. 8A-8F, thermal oxide 53, charge storage layer 54, dielectric layer 56, poly-1 layer 57, CVD layer 58 and mask 59 are all formed in the same manner as in the embodiment of FIGS. 5A-5F. However, rather than etching all the way down to the substrate between the first group of memory gates, the etching stops at charge storage layer 54, as illustrated in FIG. 8B.

Figure 8C:
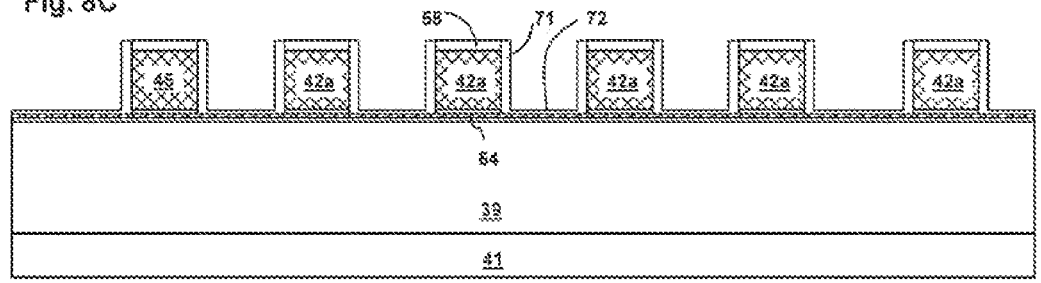

A dielectric layer 71 is formed on the exposed side walls of the memory gates and select gate and a thinner dielectric layer 72 is formed on top of the charge storage layer 54, as shown in FIG. 8C. The thicker layer 71 and the thinner layer 72 can be formed at the same by way of differential oxidation, where oxidation on the polysilicon side wall is faster than oxidation on the nitride layer 54. They can be also formed by a deposit and etch back technique to form the dielectric spacer 71 on the exposed side walls of the memory gates and select gate, followed by a deposition of dielectric layer 72 on the charge storage layer.

Figure 8D:
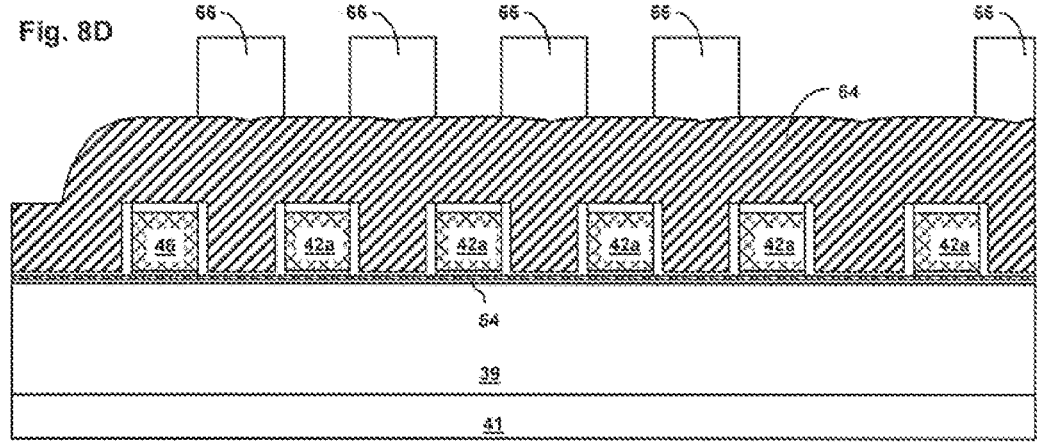
Figure 8E:
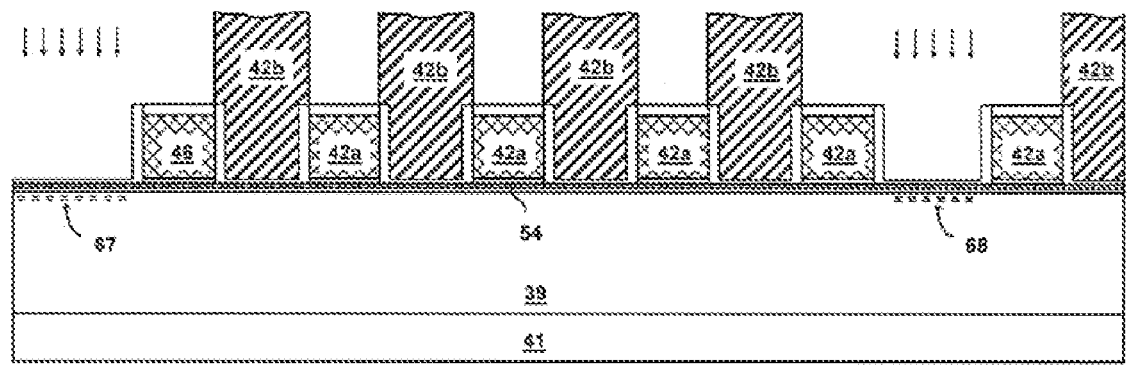
Figure 8F:
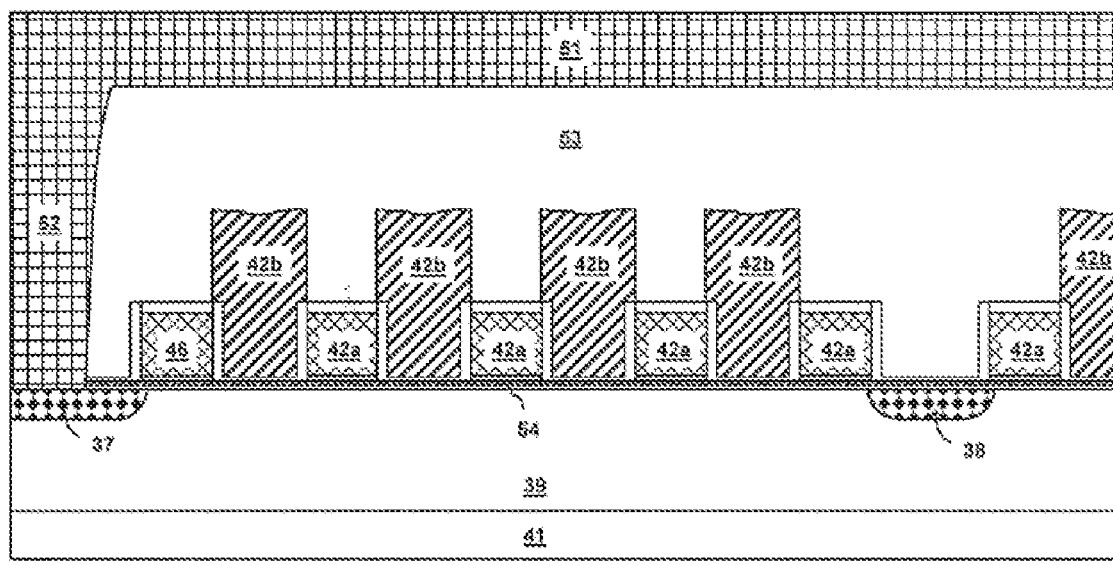

Poly-2 layer 64 is formed over CVD layer 58 and dielectric layers 71, 72, and mask 66 is formed on the poly-2 layer to define the second set of memory gates, as illustrated in FIG. 8D. The unmasked portions of the poly-2 layer, dielectric layer 63, and charge storage layer 62 are etched away anisotropically to form the second set of memory or control gates 42b, as illustrated in FIG. 8E. Thereafter, as shown in FIGS. 8E and 8F, the $P^{31}$ or $As^{75}$ dopants are implanted to form bit line diffusion 37 and source diffusion 38, the glass layer 53 is deposited and etched, and bit lines 51 and bit line contacts 52 are formed as in the embodiment of FIGS. 5A-5F.

The memory array formed by the process of FIGS. 8A-8F differs from the embodiment of FIGS. 2-4 in that a single charge storage layer 54 serves as the charge storage gates for all of the cells in the row. However, the operation and use of the array are the same as that described above.

In the embodiment of FIGS. 9A-9F, oxide layer 53, charge storage layer 54, dielectric layer 56, poly-1 layer 57, and CVD layer 58 are once again formed in the same manner as in the embodiment of FIGS. 5A-5F, and a photolithographic mask 59 is formed over the CVD layer to define one of the two groups of gates. However, in this embodiment, row select gate 46 and the memory gates next to common source diffusion 38 are formed from the poly-2 material, rather than the poly-1, and those gates, therefore, are not defined by mask 59.

Figure 9A:
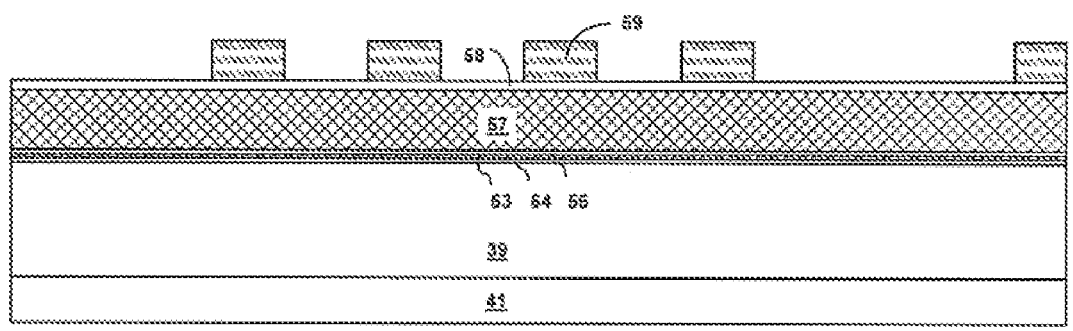
Figure 9B:
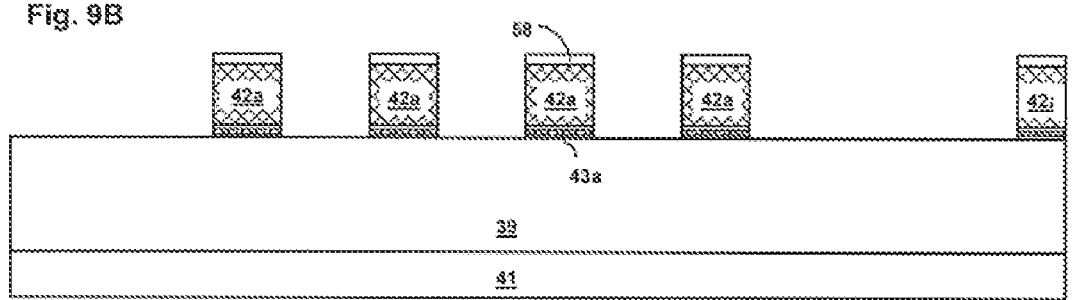
Figure 9C:
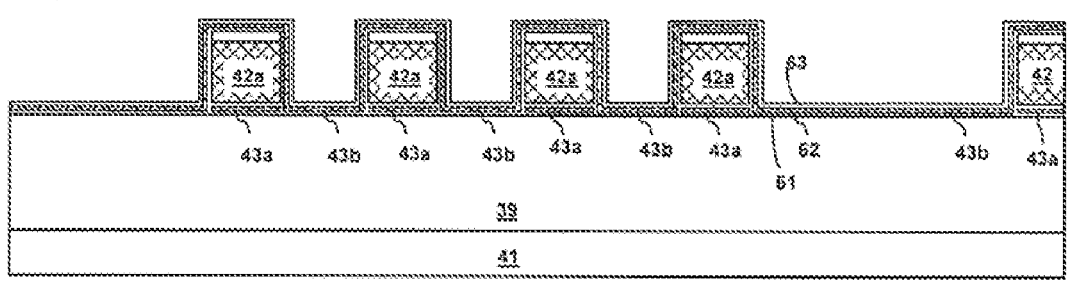
Figure 9D:
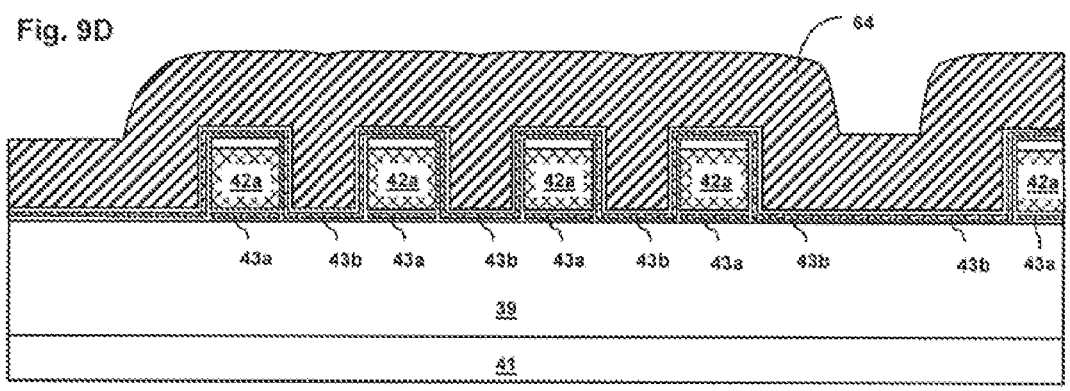

The unmasked portions of CVD layer 58, poly-1 layer 57, dielectric layer 56, charge storage layer 54 and oxide layer 53 are etched away anisotropically to form memory gates 42a and charge storage gates 43a. Thereafter, oxide layer 61, charge storage layer 62, and dielectric layer 63 are deposited as shown in FIG. 9C, and poly-2 layer 64 is formed on dielectric layer 63, as shown in FIG. 9D.

Figure 9E:
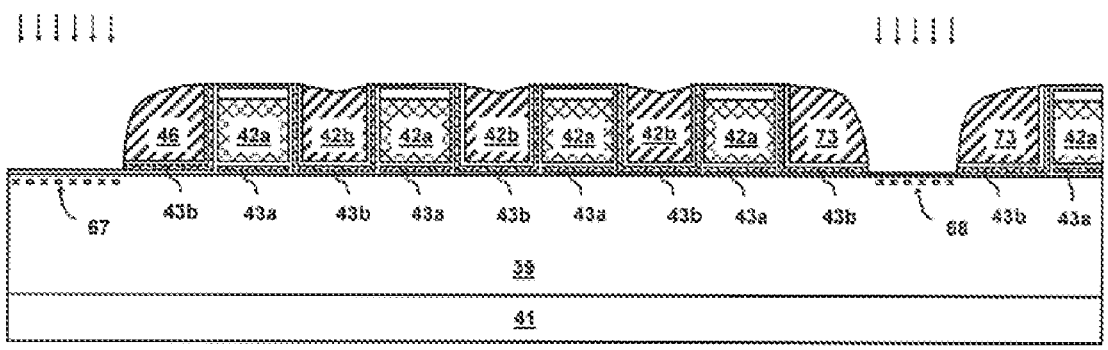
Figure 9F:
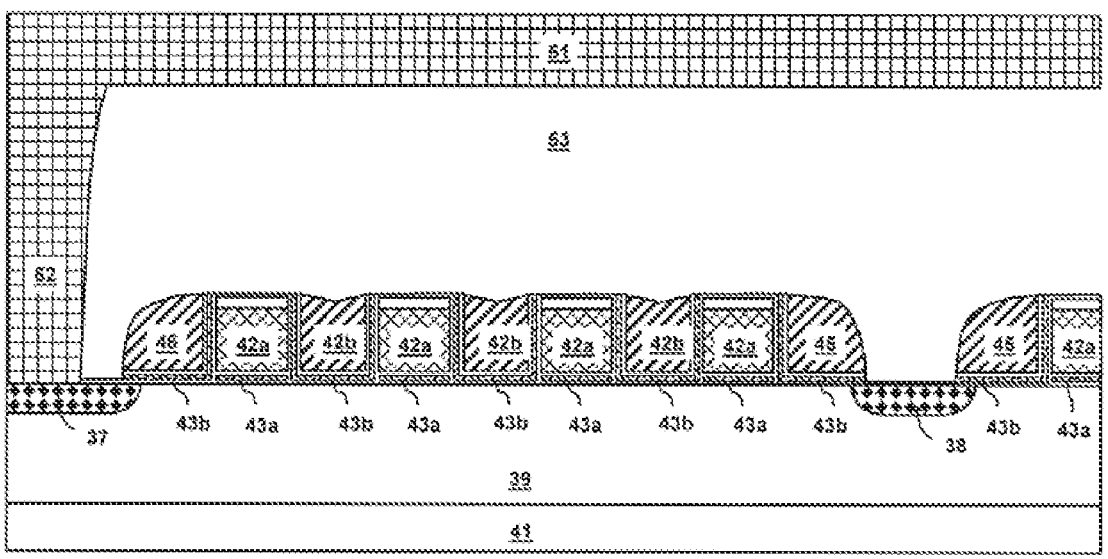

The poly-2 layer is etched away without a mask, as shown in FIG. 9E, down to about the level of the oxide above control gates 42a, thus forming select gate 46, memory gates 42b, and the two gates 73 next to the common source diffusion.

The dopants are then implanted to form bit line diffusion 37 and source diffusion 38, the glass layer 53 is deposited and etched, and bit lines 51 and bit line contacts 52 are formed as in the other embodiments.

Although the order and the manner in which some of the gates is somewhat different, they are still self-aligned. This array functions in the same way as the embodiment of FIGS. 2-4, and its operation and use are as described above.

The embodiment of FIGS. 10A-10F is a combination of the embodiments of FIGS. 8A-8F and FIGS. 9A-9F in that the charge storage gates are formed from a single layer and the gates at the ends of the rows are formed of the poly-2 material rather than the poly-1.

Figure 10A:
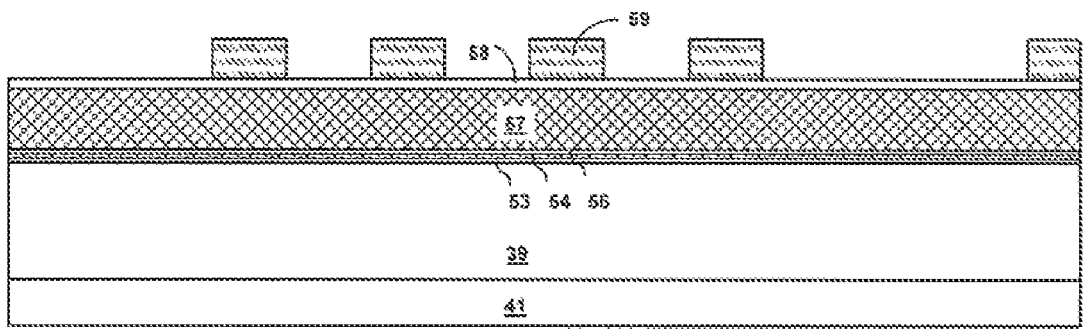
Figure 10B:
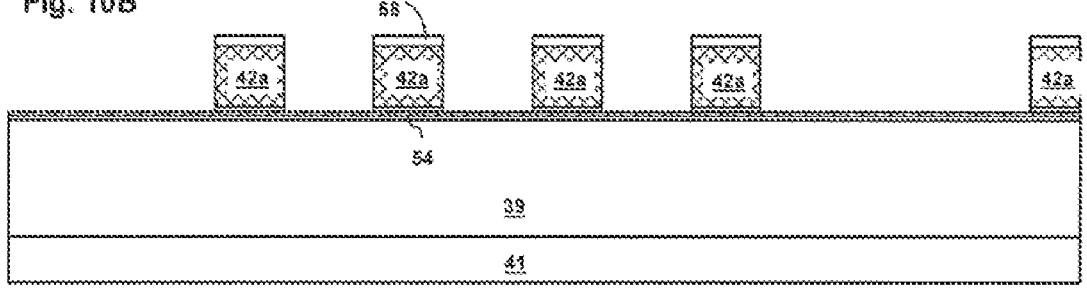

Oxide layer 53, charge storage layer 54, dielectric layer 56, poly-1 layer 57, CVD layer 58 and mask 59 are formed as shown in FIG. 10A, with the mask once again defining the gates for the interior cells, but not the gates at the ends of the rows. The exposed portions of the CVD layer, the poly-1 layer and the dielectric layer are etched away anisotropically to form memory gates 42a, with the etch stopping at charge storage layer 54, as illustrated in FIG. 10B.

Figure 10C:
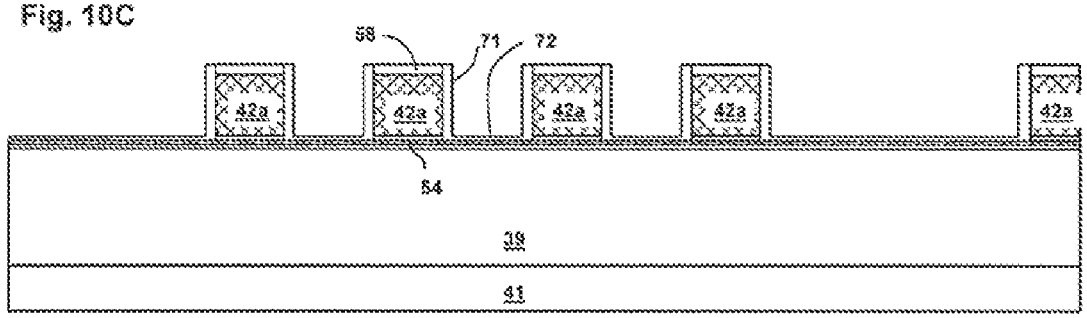
Figure 10D:
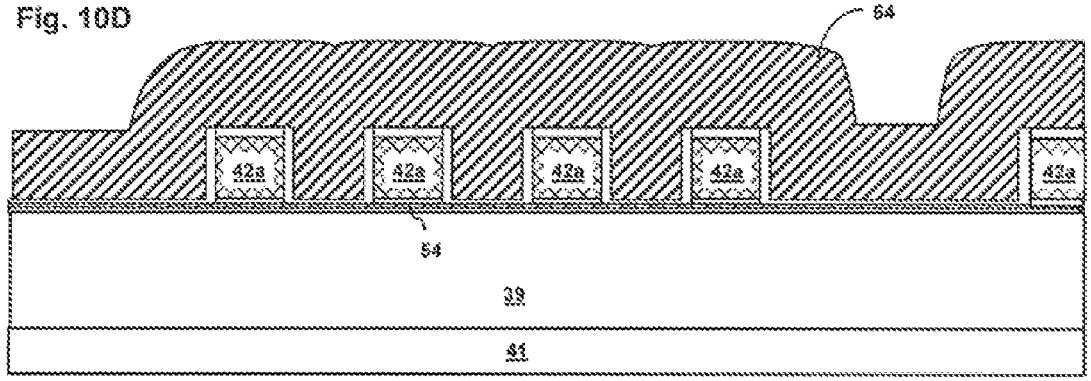
Figure 10E:
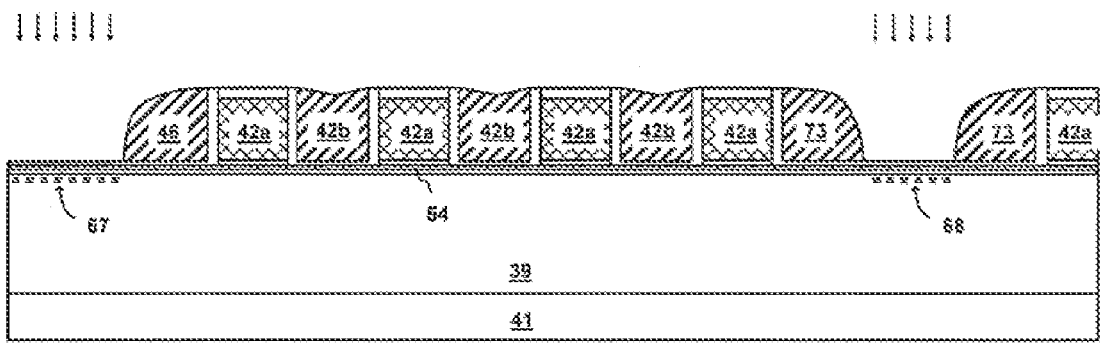
Figure 10F:
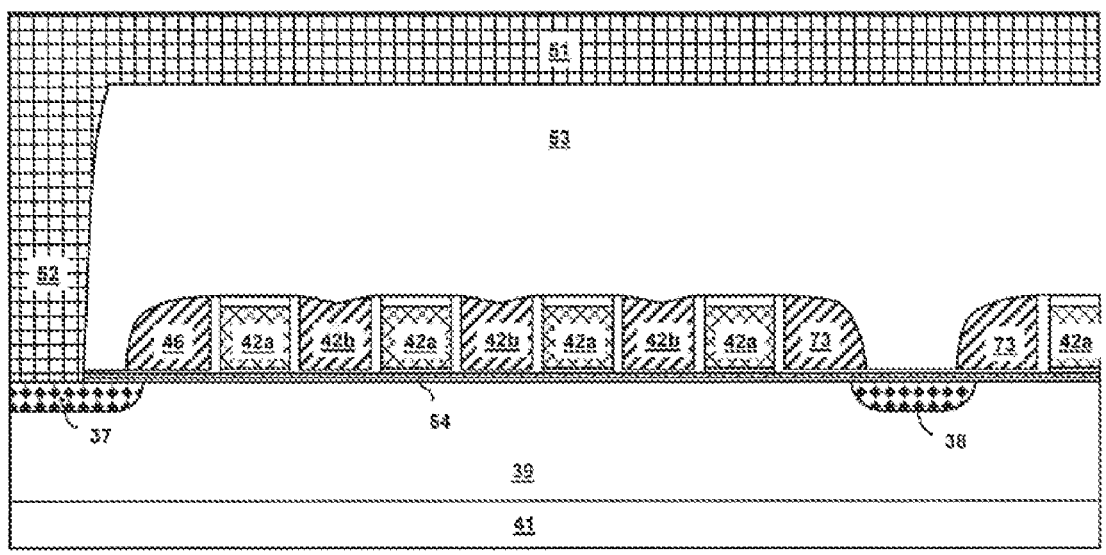

Dielectric layers 71, 72 are formed on the side walls of the memory gates and on the surface of the charge storage layer, and poly-2 layer 64 is formed over the dielectric layers, as shown in FIGS. 10C and 10D. The poly-2 layer is etched anisotropically without a mask to form select gate 46, memory gates 42b and end gates 73 as in the embodiment of FIGS. 9A-9F and as illustrated in FIG. 10E.

The dopants are then implanted to form bit line diffusion 37 and source diffusion 38, the glass layer 53 is deposited and etched, and bit lines 51 and bit line contacts 52 are formed as in the other embodiments.

The array produced by the process of FIGS. 10A-10F functions in the same manner as those produced by the other embodiments, and its operation and use are as described above with specific reference to the embodiment of FIGS. 2-4.

The invention has a number of important features and advantages. It provides a NAND flash memory cell array with significantly smaller cell size and greater cell density than memory structures heretofore provided. The memory gates and charge storage gates are stacked and arranged in rows between a bit line diffusion and a common source diffusion. The gates in adjacent cells are immediately adjacent to each other, with only a layer of dielectric and/or charge storage material between them. The gates within each cell are self-aligned, and the gates in adjacent cells overlap or are self-aligned with each other without any N-type doped diffusion between them. Only one select gate is needed, and the array is biased so that all of the memory cells can be erased simultaneously, while programming is done on a bit selectable basis.

In one mode of operation, programming is done by hot electron injection from silicon substrate to the charge storage gates to build up a negative charge in the charge storage gates, and erasing is done by channel tunneling from the charge storage gates to the silicon substrate. In another, programming is done by hot hole injection from the silicon substrate to the charge storage gates, and erasing is done by channel tunneling of electrons from the silicon substrate to the charge storage gates.

It is apparent from the foregoing that a new and improved NAND flash memory and process of fabrication have been provided. While only certain presently preferred embodiments have been described in detail, as will be apparent to those familiar with the art, certain changes and modifications can be made without departing from the scope of the invention as defined by the following claims.

The invention claimed is:

1. A process of manufacturing a memory cell array, comprising the steps of: forming a layer of dielectric material on a substrate, forming a first charge storage layer on the dielectric material, forming a second layer of dielectric material on the charge storage layer, forming a first layer of conductive material on the second layer of dielectric material, anisotropically removing portions of the conductive material, the dielectric material, and the charge storage layer to form a select gate and a first group of spaced apart memory cells which are arranged in a row with each of the cells having a memory gate positioned above a charge storage gate, forming an additional layer of dielectric material on exposed portions of the substrate between the cells in the first group and on the side walls of the select gate and the memory gates, depositing a second charge storage layer on the additional layer of dielectric material, depositing a further layer of dielectric material on the second charge storage layer, depositing a second layer of conductive material on the dielectric material on the second charge storage layer, removing portions of the second layer of conductive material and the second charge storage material above the memory cells in the first group to form a second group of memory cells having memory gates and charge storage gates positioned between the memory cells in the first group, forming a bit line diffusion in the substrate next to the select gate at one end of the row, forming a common source diffusion in the substrate at the end of the row opposite the bit line diffusion, and forming a bit line which overlies that row of cells and a bit line contact which interconnects the bit line and the bit line diffusion.

2. The process of claim 1 wherein the dielectric material is formed on the substrate by thermally growing a layer of oxide to a thickness of about 40 Å to 100 Å.

3. The process of claim 1 wherein the charge storage layers are formed by depositing a material selected from the group consisting of a nitride and a combination of nitride and oxide to a thickness on the order of 60 Å to 200 Å.

4. The process of claim 1 wherein the layer of dielectric material on the first charge storage layer is formed of a material selected from the group consisting of oxide and nitrided to a thickness about 30 Å to 100 Å.

5. The process of claim 1 wherein the layers of conductive material are selected from the group consisting of polysilicon and polycide and are deposited to a thickness on the order of 1000 Å-2500 Å.

6. The process of claim 5 wherein the conductive materials are doped with a material selected from the group consisting of phosphorus, arsenic, boron and combinations thereof to a level on the order of $10^{20}$ to $10^{21}$ per $cm^3$.

7. A process of manufacturing a memory cell array, comprising the steps of: forming a layer of dielectric material on a substrate, forming a charge storage layer on the dielectric material, forming a second layer of dielectric material on the charge storage layer, forming a first layer of conductive material on the second layer of dielectric material, anisotropically removing portions of the conductive material but not the charge storage layer to form a select gate and a first group of spaced apart memory cells which are arranged in a row with each of the cells having a memory gate positioned above the layer of charge storage material, forming an additional layer of dielectric material on the charge storage material between the cells and on the side walls of the select gate and the memory gates, depositing a second layer of conductive material on the additional layer of dielectric material, removing portions of the second layer of conductive material to form a second group of memory cells having memory gates between the memory cells in the first group, forming a bit line diffusion in the substrate next to the select gate at one end of the row, forming a common source diffusion in the substrate at the end of the row opposite the bit line diffusion, and forming a bit line which overlies that row of cells and a bit line contact which interconnects the bit line and the bit line diffusion.

8. A process of manufacturing a memory cell array, comprising the steps of: forming a layer of dielectric material on a substrate, forming a first charge storage layer on the dielectric material, forming a second layer of dielectric material on the charge storage layer, forming a first layer of conductive material on the second layer of dielectric material, anisotropically removing portions of the conductive material, the dielectric material, and the charge storage layer to form a first group of spaced apart memory cells which are arranged in a row with each of the cells having a memory gate positioned above a charge storage gate, forming an additional layer of dielectric material on exposed portions of the substrate between the cells in the first group and on the side walls of the memory gates, depositing a second charge storage layer on the additional layer of dielectric material, depositing a further layer of dielectric material on the second charge storage layer, depositing a second layer of conductive material on the dielectric material on the second charge storage layer, removing portions of the second layer of conductive material and the second charge storage material above the memory cells in the first group to form a select gate with a charge storage gate below it at one end of the row, a second group of memory cells having memory gates and charge storage gates positioned between the memory cells in the first group, and an end gate at the end of the row opposite the select gate, forming a bit line diffusion in the substrate next to the select gate, forming a common source diffusion in the substrate next to the end gate, and forming a bit line which overlies that row of cells and a bit line contact which interconnects the bit line and the bit line diffusion.

9. A process of manufacturing a memory cell array, comprising the steps of: forming a layer of dielectric material on a substrate, forming a charge storage layer on the dielectric material, forming a second layer of dielectric material on the charge storage layer, forming a first layer of conductive material on the second layer of dielectric material, anisotropically removing portions of the conductive material but not the charge storage layer to form a first group of spaced apart memory cells which are arranged in a row with each of the cells having a memory gate positioned above the charge storage layer, forming an additional layer of dielectric material on the charge storage layer in the spaces between the cells and on the side walls of the memory gates, depositing a second layer of conductive material on the additional layer of dielectric material, removing portions of the second layer of conductive material to form a select gate at one end of the row, a second group of memory cells having memory gates positioned between the memory cells in the first group, and an end gate at the end of the row opposite the select gate, forming a bit line diffusion in the substrate next to the select gate, forming a common source diffusion in the substrate next to the end gate, and forming a bit line which overlies the row of cells and a bit line contact which interconnects the bit line and the bit line diffusion.

* * * * *